(12) United States Patent
Tseng et al.

(10) Patent No.: US 7,804,589 B2
(45) Date of Patent: Sep. 28, 2010

(54) SYSTEM AND METHOD FOR TESTING LIGHT-EMITTING DEVICES

(75) Inventors: I-Shih Tseng, Tao-Yuan Hsien (TW); Jeff Lee, Tao-Yuan Hsien (TW); Min-Hung Chang, Tao-Yuan Hsien (TW)

(73) Assignee: Chroma Ate Inc., Tao-Yuan Hsien (TW)

( * ) Notice: Subject to any disclaimer, the term of this patent is extended or adjusted under 35 U.S.C. 154(b) by 0 days.

(21) Appl. No.: 12/429,578

(22) Filed: Apr. 24, 2009

(65) Prior Publication Data

US 2009/0309606 A1  Dec. 17, 2009

(30) Foreign Application Priority Data

Jun. 13, 2008 (TW) .............................. 97210477 U
Sep. 24, 2008 (TW) .............................. 97136723 A

(51) Int. Cl.
*G01J 1/00* (2006.01)
*H01J 3/14* (2006.01)
*H01J 40/14* (2006.01)

(52) U.S. Cl. ...................... 356/213; 250/216; 250/221; 250/227.28

(58) Field of Classification Search ......... 356/213–236; 250/458.1, 459.1, 372, 370.11, 221, 214.1, 250/227.28, 231.13; 347/129; 324/752, 324/501
See application file for complete search history.

(56) References Cited

U.S. PATENT DOCUMENTS

| 4,730,115 | A  | * | 3/1988 | Abe .............................. 250/551 |
| 6,476,376 | B1 | * | 11/2002 | Biegelsen et al. ............ 250/221 |
| 7,193,697 | B2 | * | 3/2007 | Sung et al. ................ 356/237.1 |
| 7,626,403 | B2 | * | 12/2009 | Ou et al. ...................... 324/752 |
| 2006/0022124 | A1 | * | 2/2006 | Chuang ................. 250/227.28 |
| 2006/0050133 | A1 | * | 3/2006 | Kokubo ....................... 347/129 |

* cited by examiner

*Primary Examiner*—Sang Nguyen
(74) *Attorney, Agent, or Firm*—Rosenberg, Klein & Lee

(57) ABSTRACT

A method for testing light-emitting devices in a batch-wise, associated with a system for the same purpose, comprises the steps of: preparing the light-emitting devices on a moving carrier unit in a manner of aligning a predetermined longitudinal direction of the light-emitting devices with a predetermined transportation direction of the moving carrier unit, each of the light-emitting devices further having plural light-emitting elements; transporting orderly the light-emitting devices to pass a test area on a base of the system, in which the base energizes only the light-emitting elements within the test area; and, a solar cell module detecting continuously the energized light-emitting elements within the test area and further forming signals with respect to photo energy received in the test area.

3 Claims, 17 Drawing Sheets

US 7,804,589 B2

SYSTEM AND METHOD FOR TESTING LIGHT-EMITTING DEVICES

This application claims the benefit of two Taiwan Patent Applications, Serial No. 097210477 filed Jun. 13, 2008 and Serial No. 097136723 filed Sep. 24, 2008, and the subject matter of which is incorporated herein by reference.

BACKGROUND OF THE INVENTION (1) Field of the Invention

The invention relates to a system and an accompanying method for testing light-emitting devices, and more particularly to the test station/equipment and the test method that utilize solar cells/cell modules.

(2) Description of the Prior Art

In the art, to obtain the total luminous flux (or say, lumen) of a light-emitting device, an integrating sphere is usually used. The operation of a typical integrating sphere can be concisely elucidated in FIG. 1. As shown, an integrating sphere 11 is connected with an optical spectrum analyzer 14 via an optical fiber 12. The integrating sphere 11 further includes thereinside a diffusing baffle 13. An LED to be tested 15 is positioned at an input port 16 located at a lower part of the integrating sphere 11 in FIG. 1. An output port 17 for transporting out the diffused light originally emitted by the LED 15 is included in an upper part of the integrating sphere 11 as shown.

In the testing, while the LED 15 is energized, a light is received by the integrating sphere 1 through the input port 16. In the integrating sphere 11, the light experiences various reflection and diffusion, and the diffused light finally reaches the output port 17 to be further transported to the optical spectrum analyzer 14 via the optical fiber 12. After a comparison with data from testing a reference known light under the same testing setup, the total luminous flux of the LED 15 can be obtained. However, the aforesaid testing mode constructed with the integrating sphere 11 is only better applicable to the light sources with specific directivity, not to all kinds of light sources. Further, the size of the integrating sphere 11 and the accompanying facilities usually limits the usage of the integrating sphere 11 only in the laboratory. In addition, reciprocally positioning and replacing the light-emitting devices (LED 15 for example) for testing outside the input port 16 can sometimes imply an inevitable labor load and time-consumption. More, the cost of the integrating sphere 11 is often not affordable to all those they need.

Aiming at the foregoing disadvantages in applying the integrating sphere 11, a total luminous flux testing system 20 as shown in FIG. 2 by a perspective view as well as FIG. 3 by a cross-sectional view is proposed. In this effort, the testing system 20 is introduced to have solar cell modules 21 mounted to each interior wall of a testing box 22 (all six interior walls as shown). The energized device under test (DUT) 23 mounted on a conveyor belt 24 is shipped to go through the testing box 22, entering from an inlet 28 and leaving from an outlet 29 at a lower portion of the testing box 22. While the DUT 23 is in the testing box 22, photo energy of the energized DUT 23 is received by the solar cell modules 21.

In the testing system 20, two pathways are provided to forward the received photo energy of the energized DUT 23 inside the testing box 22: one connecting directly to a processor 25 via a cable 26, and another connecting to an optical spectrum analyzer 27 via an optical fiber 27a and then further to the processor 25. By integrating the data from the two pathways, the processor 25 can then calculate the total luminous flux of the DUT 23.

By compared to the integrating sphere apparatus in FIG. 1, the testing system 20 in FIG. 2 is superior in cost and maintenance. The non-stop transportation of the DUT 23 by the conveyor belt 24 does also provide the advantage in saving testing time. Further, the accuracy in computing the total luminous flux by two difference entries, one direct from the solar cell modules 21 and one from the optical spectrum analyzer 27, can be better guaranteed.

Nevertheless, in either the integrating sphere apparatus of FIG. 1 or the testing system of FIG. 2, only the value of the total luminous flux for the DUT can be obtained. It is all right for the aforesaid apparatus and the system to determine the quality of the DUT if the DUT includes a single light-emitting element. Yet, to a DUT having plural light-emitting elements (for example, the light bar-shape DUT shown in FIGS. 2 and 3), the aforesaid apparatus and the system mean nothing in locating the problem element or elements. Namely, a number of an accurate total luminous flux provides no immediate help to locate a dumb element in the DUT having plural light-emitting elements. Thus, additional quality control effort in the manufacturer end must be spent so as to promptly correct the problem device and so as to ensure the yield of the devices.

SUMMARY OF THE INVENTION

Accordingly, it is an object of the present invention is to provide a system for testing light-emitting devices, which can quickly and precisely locate ill-luminous elements in the devices having plural light-emitting elements.

It is another object of the present invention to provide a concise-structured test station that is applicable to test various kinds of light-emitting devices.

It is a further object of the present invention to provide a less-cost test system that can be automatically operated, and such that the cost required in examining the light-emitting devices can be substantially reduced.

It is an additional object of the present invention to provide a method for testing light-emitting devices, by which ill-luminous elements in a light-emitting device under test can be promptly located.

It is one more object of the present invention to provide a system and an accompanying method for testing light-emitting devices that utilize solar cell modules as receptors to minimize the installation space, increase the test efficiency, and boost the testing competence.

In accordance with the present invention, the system for testing light-emitting devices in a batch-wise can include a base for energizing on-top devices, a moving carrier unit, and a solar cell module. The base can upload a plurality of in-motion light-emitting devices, each of which can further include a plurality of light-emitting elements, and the base can also energize properly each of the light-emitting elements on top thereof. The moving carrier unit is to transport the light-emitting devices in a batch-wise to pass the base for testing. The solar cell module can include at least a solar cell.

The method for testing light-emitting devices is introduced to accompany the aforesaid test system of the present invention, in which each of the light-emitting devices further has a plurality of light-emitting elements arranged in a predetermined longitudinal direction. In the test system of the present invention, a test area for the light-emitting elements to be tested is defined at a space between the solar cell module and the base. The method comprises the steps of: (a) preparing a plurality of the light-emitting devices on the moving carrier unit in a manner of aligning the predetermined longitudinal direction of each light-emitting device with a predetermined transportation direction of the moving carrier unit; (b) transporting orderly the light-emitting devices to pass the test area on the base, the base energizing only the light-emitting elements within the test area; and (c) the solar cell module detecting continuously the energized light-emitting elements within the test area and further transmitting signals of received photo energy in the test area with a predetermined sampling rate.

Accordingly, the system and the method for testing light-emitting devices in accordance with the present invention can sense the change of lamination in the test area while the light-emitting devices are orderly sent through the test area. By evaluating the real-time change of the lamination and the respective state in the test area, an area of abnormal light-emitting elements in the respective light-emitting device can be located. Upon such an arrangement, quality control and correction steps after locating the abnormal area can be speeded up, and thereby the yield of the light-emitting devices can be substantially increased.

All these objects are achieved by the system and the method for testing light-emitting devices described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a system and a method for testing light-emitting devices. In the following description, numerous details are set forth in order to provide a thorough understanding of the present invention It will be appreciated by one skilled in the art that variations of these specific details are possible while still achieving the results of the present invention. In other instance, well-known components are not described in detail in order not to unnecessarily obscure the present invention.

In the following description, the light-emitting device is realized in a light-bar form having a plurality of light-emitting elements arranged thereon in a longitudinal direction. Also, some structures or linkages to form the machinery of the present invention may be omitted so as not to obscure the description and drawings.

Figure 1:
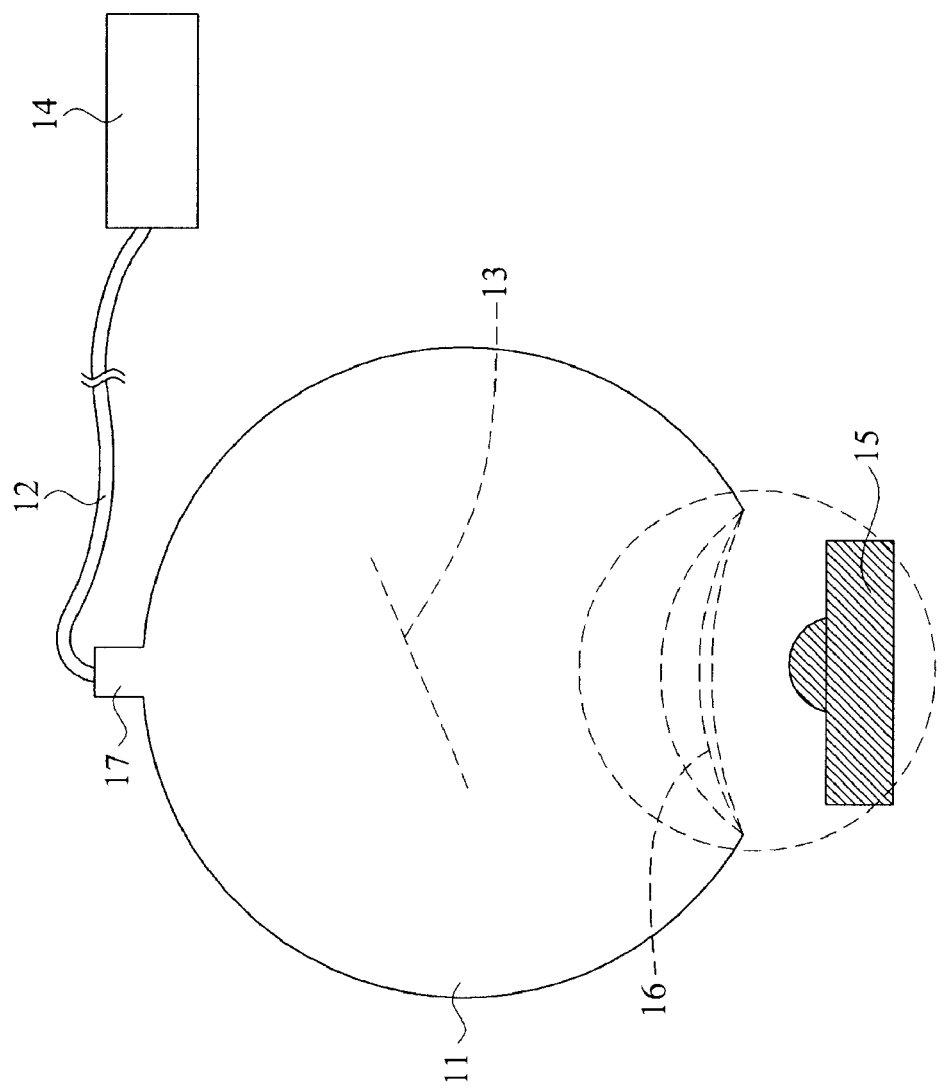
FIG. 1 is a schematic view of a conventional integrating sphere apparatus.
Figure 2:
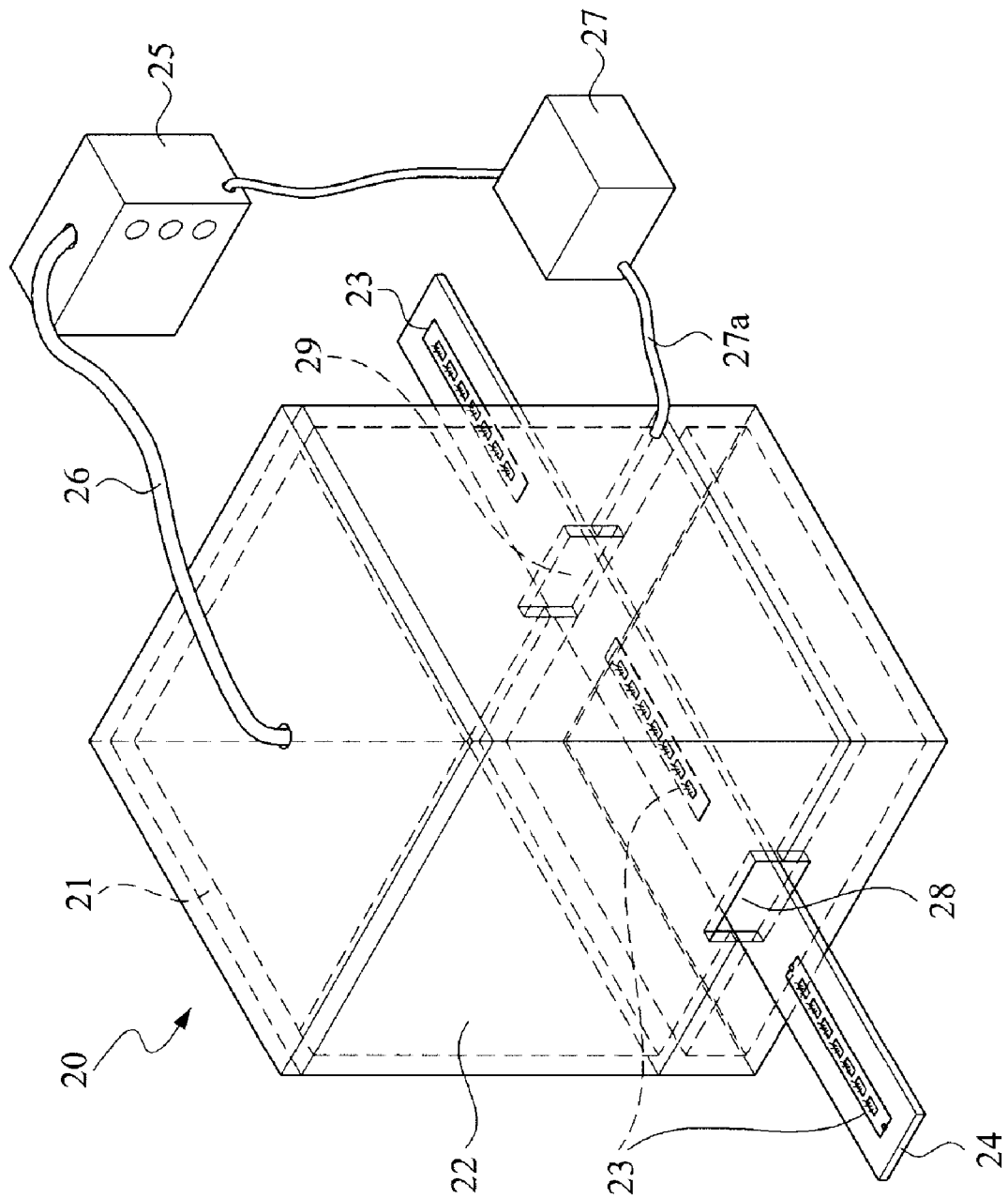
FIG. 2 is a schematic view of a conventional total luminous flux testing system.
Figure 3:
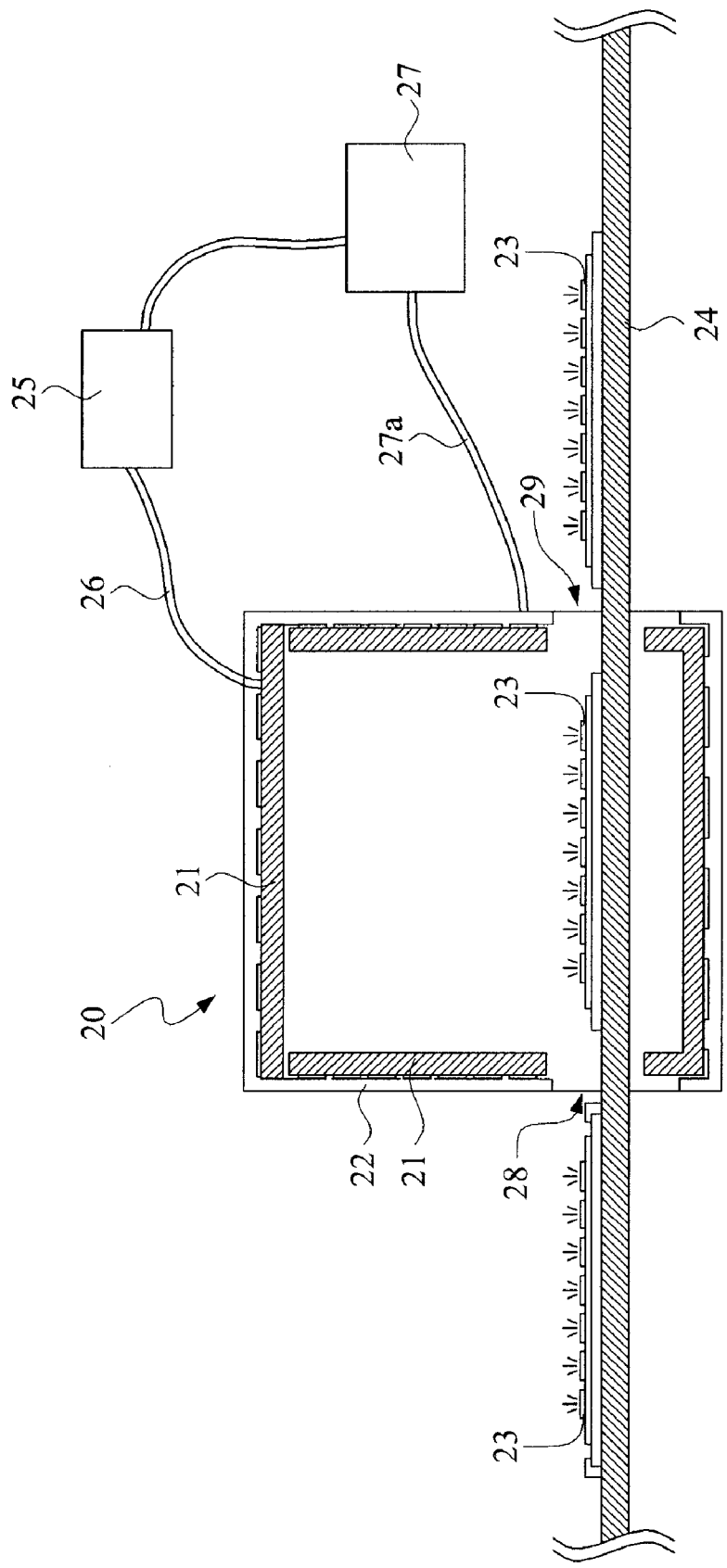
FIG. 3 is another view of FIG. 2, showing partly in a cross-sectional pattern.
Figure 4:
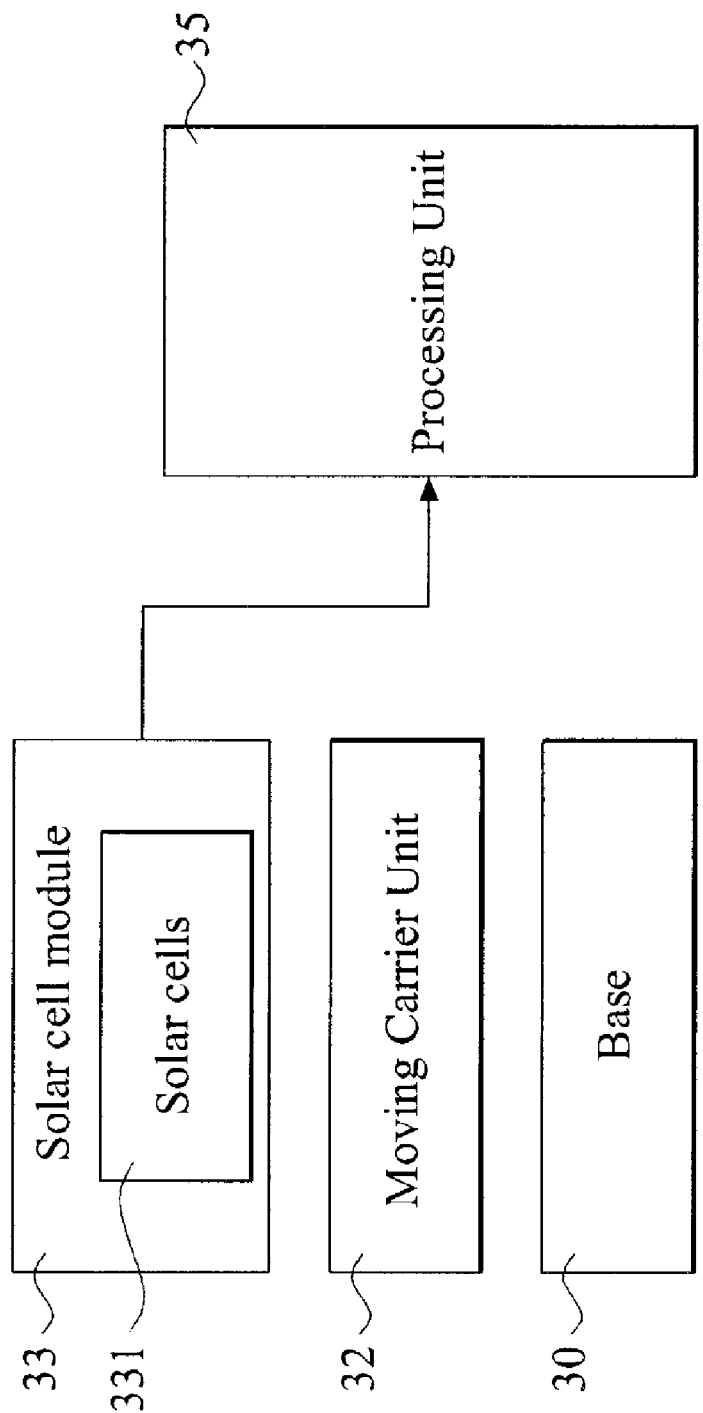
FIG. 4 is a block diagram of the system for testing light-emitting devices in accordance with the present invention.

Referring now to FIG. 4, a block diagram of the test system in accordance with the present invention is shown. The system includes a base 30 for carrying and energizing the light-emitting devices under test (DUTs), a moving carrier unit 32 for transporting the DUTs to pass a test area over the base 30 in a batch-wise preferably, a solar cell module 33 having at least a solar cell 331, and a processing unit 35 for analyzing test data from the solar cell module 33.

Figure 5:
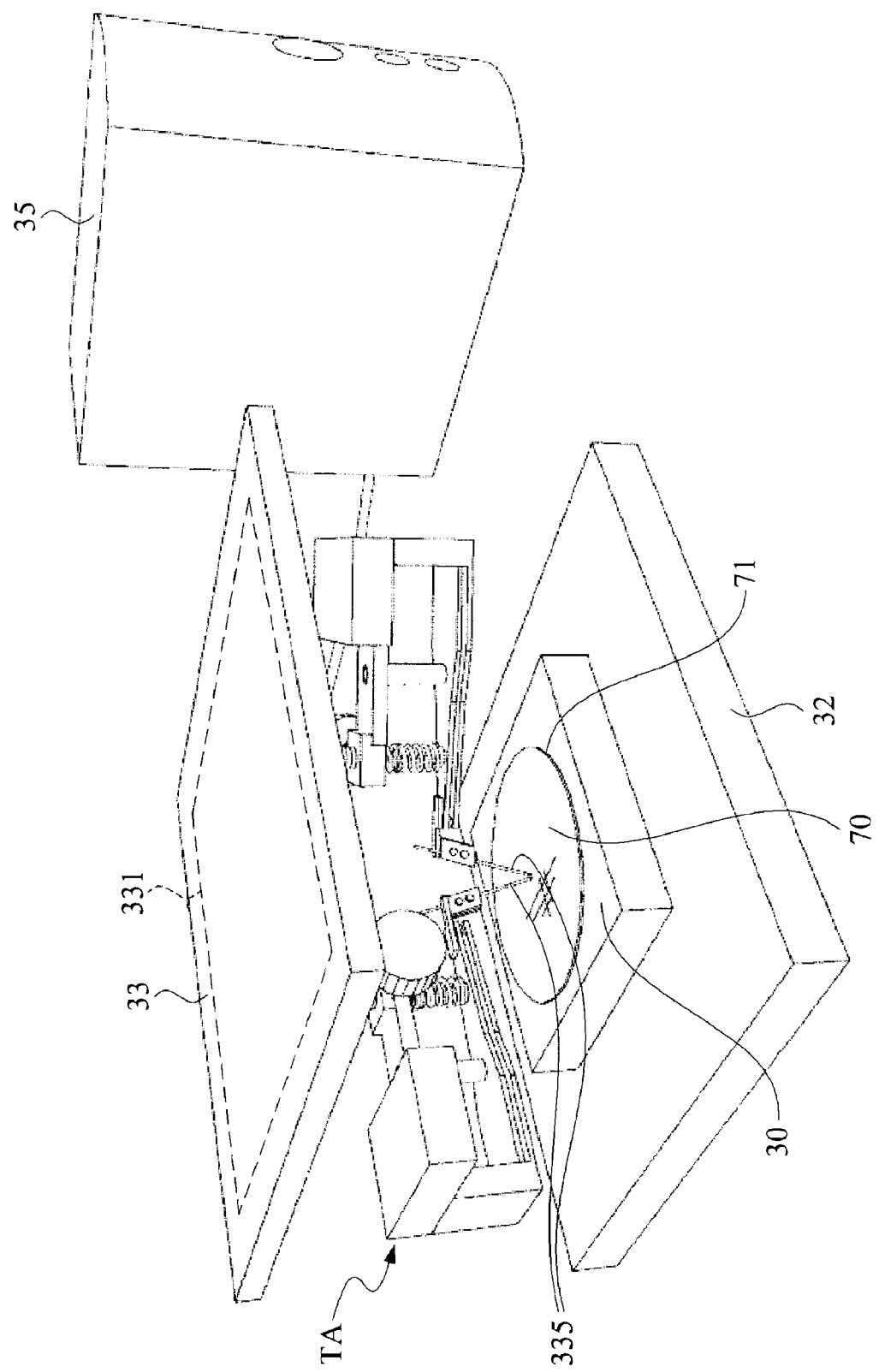
FIG. 5 is a perspective view of a preferred embodiment of the system for testing light-emitting devices in accordance with a first embodied aspect of the present invention.
Figure 6:
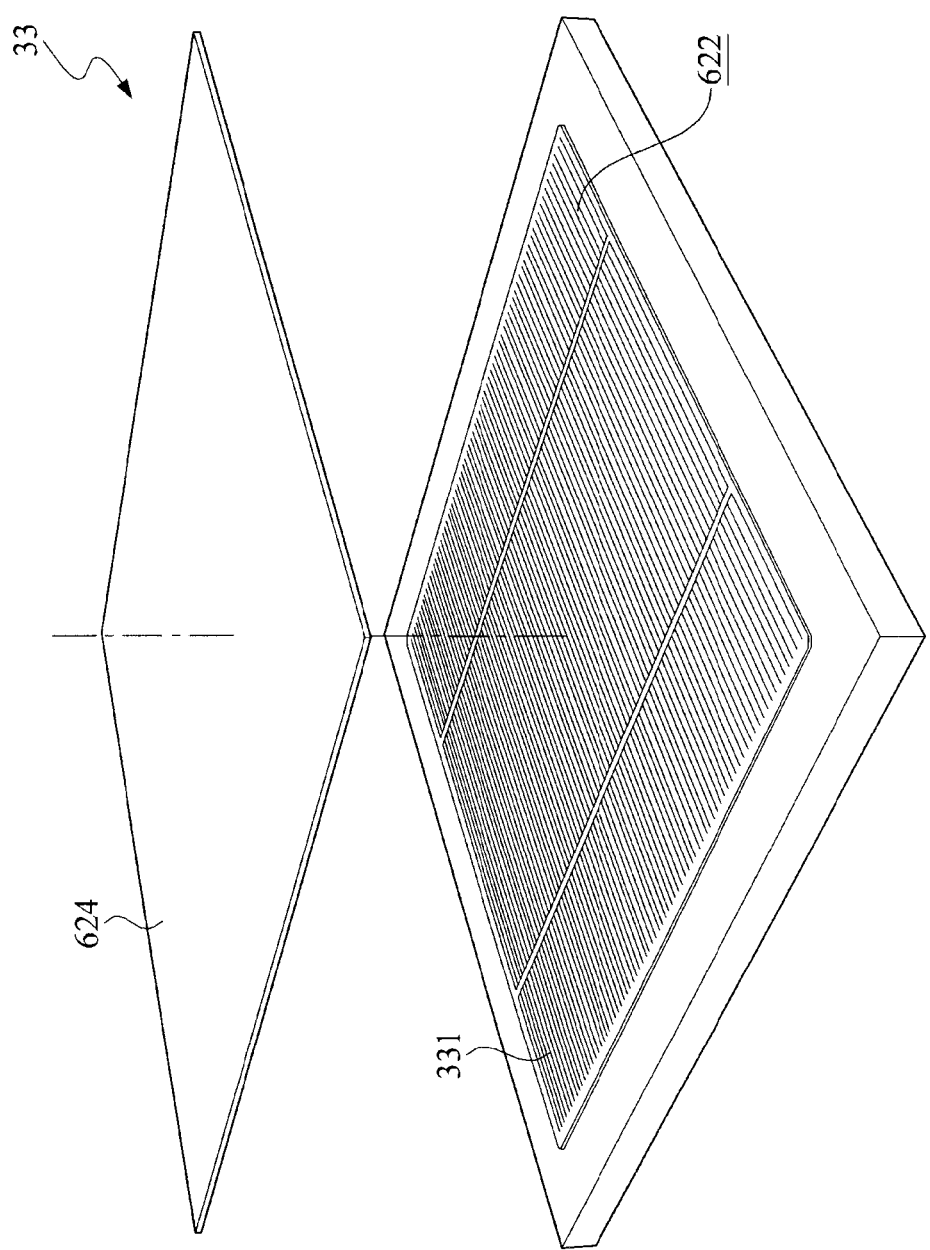
FIG. 6 shows part of FIG. 5 in an upside down view.

Referring now to FIG. 5 and FIG. 6, a first aspect of the system for testing light-emitting devices is completely shown in a perspective view and partly shown in an up-side-down view, respectively. The DUT 70 in this embodiment is the light-emitting diode (LED) chip of a wafer 71. The base 30 is embodied as a platform for resting the wafer 71. The moving carrier unit 32 is embodied as an X-Y table to carry the base 30 and also the wafer 71 on the base 30. The solar cell module 33, located above the base 30, includes a solar cell 331 with its action surface 622 to face the DUTs 71. The test area TA, a limited space under the solar cell module 33, is formed mainly to include two probes 335 to clip the DUT 70. The processing unit 35 can be embodied as a control box or a computer.

Preferably, the solar cell module 33 can further include a filter set 624 to shield the solar cell 31. In this application, the brightness respective to the visual effect can be obtained by timing the transmission function of the filter set 624 and the wavelength response function of the solar cell 331 and further to compare the timing result with a predetermined standard visual effect function. To minimize possible test errors, the solar cell 331 shall be moved closely as possible to the DUT 70, such that the photo energy of the DUT 70 received by the action surface 622 of the solar cell 331 can be much greater than that diffuses out of the solar cell 331. Namely, upon such an arrangement, the photo energy escaping the detection by the test system can be practically reduced to an ignorable degree.

Figure 7:
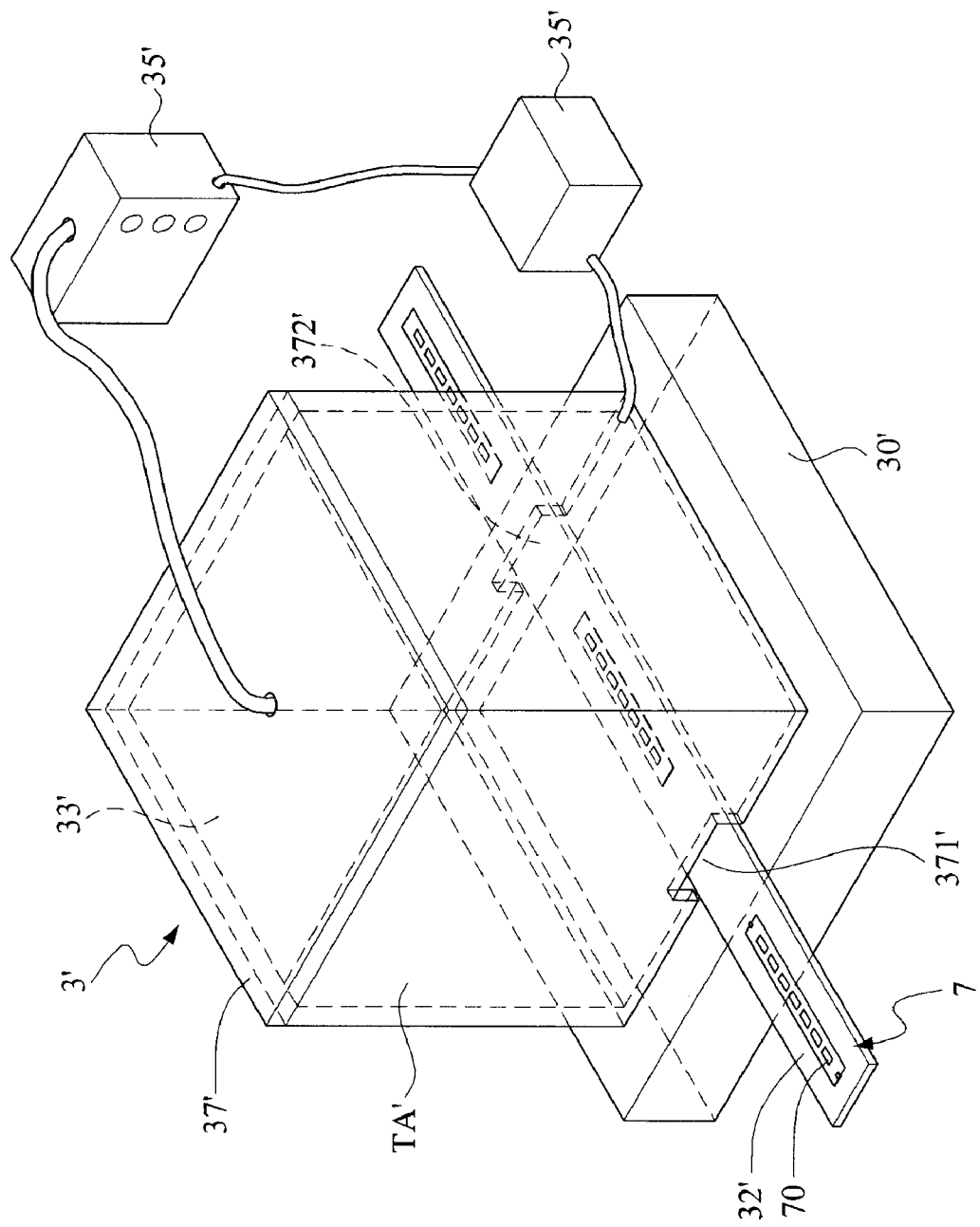
FIG. 7 is a schematic view of a preferred embodiment of the system for testing light-emitting devices in accordance with a second embodied aspect of the present invention.

Referring now to FIG. 7, a preferred embodiment showing a second aspect of the system for testing light-emitting devices in accordance with the present invention is demonstrated in a perspective view. The DUT 70 in this embodiment 3' is formed as a light bar 7 having a plurality of light-emitting elements 70. The base 30' in this aspect is embodied as a platform. The moving carrier unit 32' is embodied as a conveyor belt or chain that can carry batchly the DUTs 7 and allow the base 30' to properly energize the light-emitting elements 70 individually. Compared to the aforesaid moving carrier unit 32 of the first aspect which an X-Y table is introduced, the moving carrier unit 32' of this second aspect is to transport the DUTs 7 in a longitudinal direction. The solar cell module 33' is located to an interior roof of a square dome 37' which is constructed on the base 30' for forming thereinside a shielded test area TA' above the base 30'. The test area TA' further provides an inlet port 371' an opposing output port 372' to allow the moving carrier unit 32' to transport the DUTs 7 through the test area TA' under the solar cell module 33'. The processing unit 35' can be embodied as a control box, a computer, or a combination of electronic computing apparatuses. In particular, the base 30' is only to energize the light-emitting elements 70' within the test area TA' inside the dome 37'.

In the present invention, the method for testing light-emitting devices is introduced to accompany the aforesaid test system of the present invention, in which each of the DUTs 7 further has a plurality of light-emitting elements 70 arranged in a predetermined longitudinal direction. The method comprises the steps of: (a) preparing a plurality of the light-emitting devices (DUTs) 7 on the moving carrier unit 32' in a manner of aligning the predetermined longitudinal direction of each DUT 7 with a predetermined transportation direction of the moving carrier unit 32'; (b) transporting orderly the DUTs 7 to pass the test area TA' on the base 30' (entering through the inlet port 371' and leaving through the outlet port 372'), the base 30' energizing only the light-emitting elements 70' within the test area TA'; (c) the solar cell module 33' detecting continuously the energized light-emitting elements 70 within the test area TA' and further transmitting signals of photo energy received in the test area TA' with a predetermined sampling rate to the processing unit 35'; and (d) the processing unit 35' evaluating changes in the received photo energy and determining location of the area of abnormal light-emitting elements 70 in the respective DUT 7. Preferably, a predetermined moving speed of the moving carrier unit 32' is determined by the processing unit 35'.

In the following FIG. 8 to FIG. 12, a complete journey of a single DUT 7 to be tested by the system of this current aspect and the aforesaid method is demonstrated step by step by cross-sectional views, in which the length of the DUT 7 is less than the length of the test area TA'. Namely, the DUT 7 may be completely covered by the dome 37' at some appropriate time is this test journey.

Figure 8:
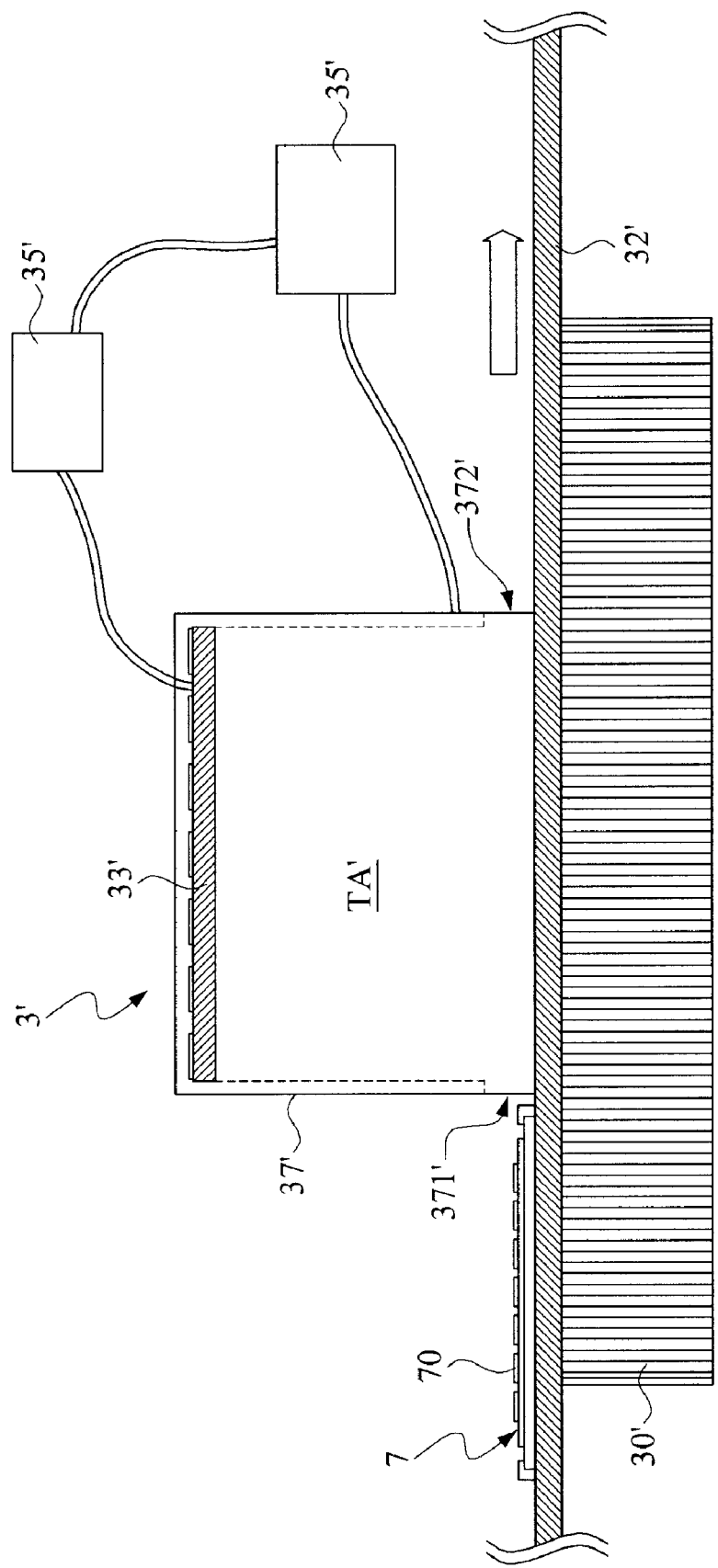
FIG. 8 shows that a DUT is ready to enter the test area of FIG. 7.

Referring now to FIG. 8, a DUT 7 having plural serial light-emitting elements 70 is transported on the moving carrier unit 32' at a predetermined longitudinal direction indicated by the arrow sign, and preferably at a predetermined speed. As shown, the DUT 7 is way to enter the test area TA' via the inlet port 37' of the dome 37'.

Figure 9:
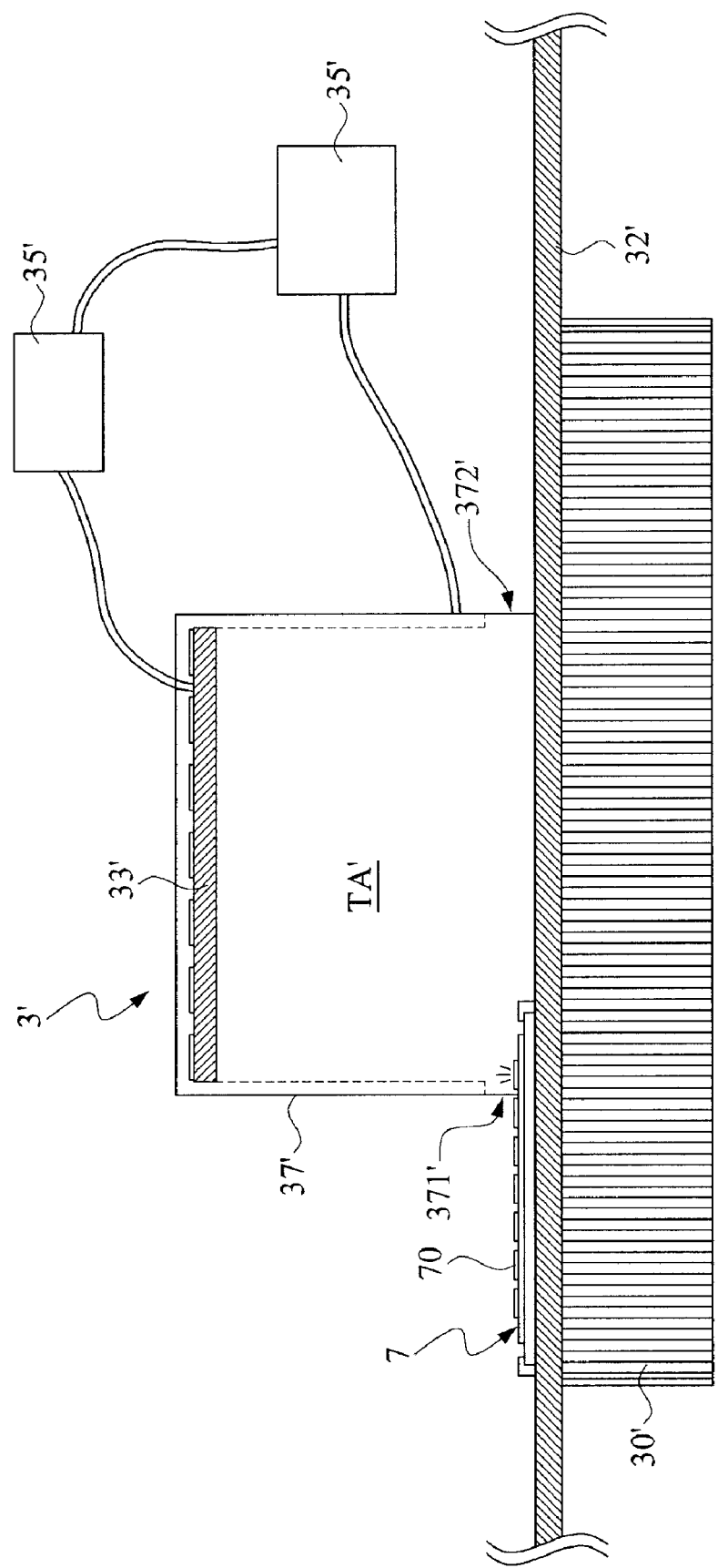
FIG. 9 shows that a DUT is entering the test area of FIG. 7.

Referring now to FIG. 9, the DUT 7 is entering the dome 37', at a state that only the leading light-emitting element 70 is located inside the dome 37', i.e. within the test area TA'. It is noted that, in the DUT 7, only the leading light-emitting element 70 is energized to light up. Namely, according to the instant method of the present invention, the base 30' is only to energize the light-emitting elements 70 within the test area TA'. At this time, the photo energy of the energized leading light-emitting element 70 is received by the solar cell module 33' located at the roof of the dome 37' over the base 30'.

Figure 10:
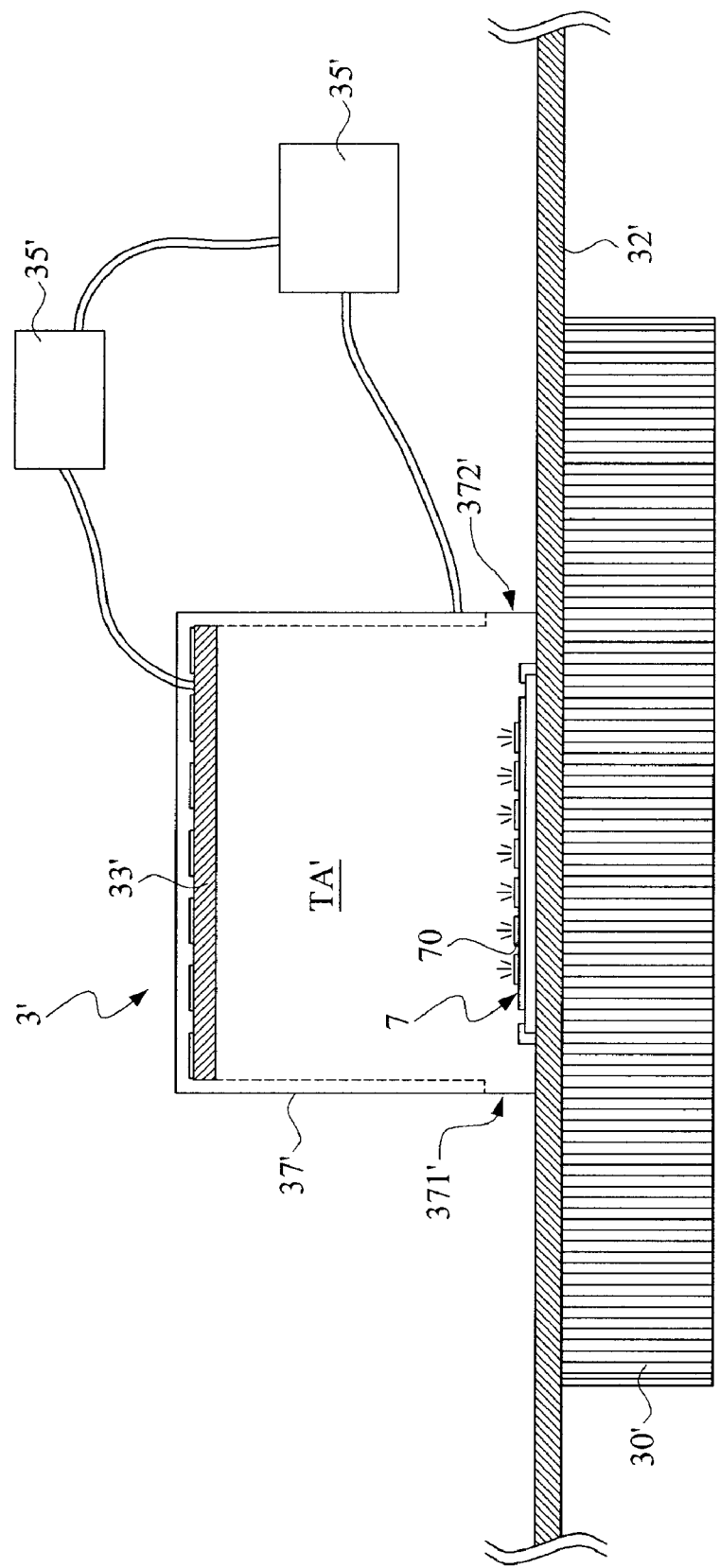
FIG. 10 shows a next step of FIG. 9, in which the DUT is moved completely into the test area.

Referring now to FIG. 10, the DUT 7 of FIG. 9 is moved forward to have the DUT 7 completely within the test area TA', and thus all the light-emitting elements 70 of the DUT 7 are lighted up. At this time, the solar cell module 33' can theoretically receive maximum photo energy during the test journey of the DUT 7.

Figure 11:
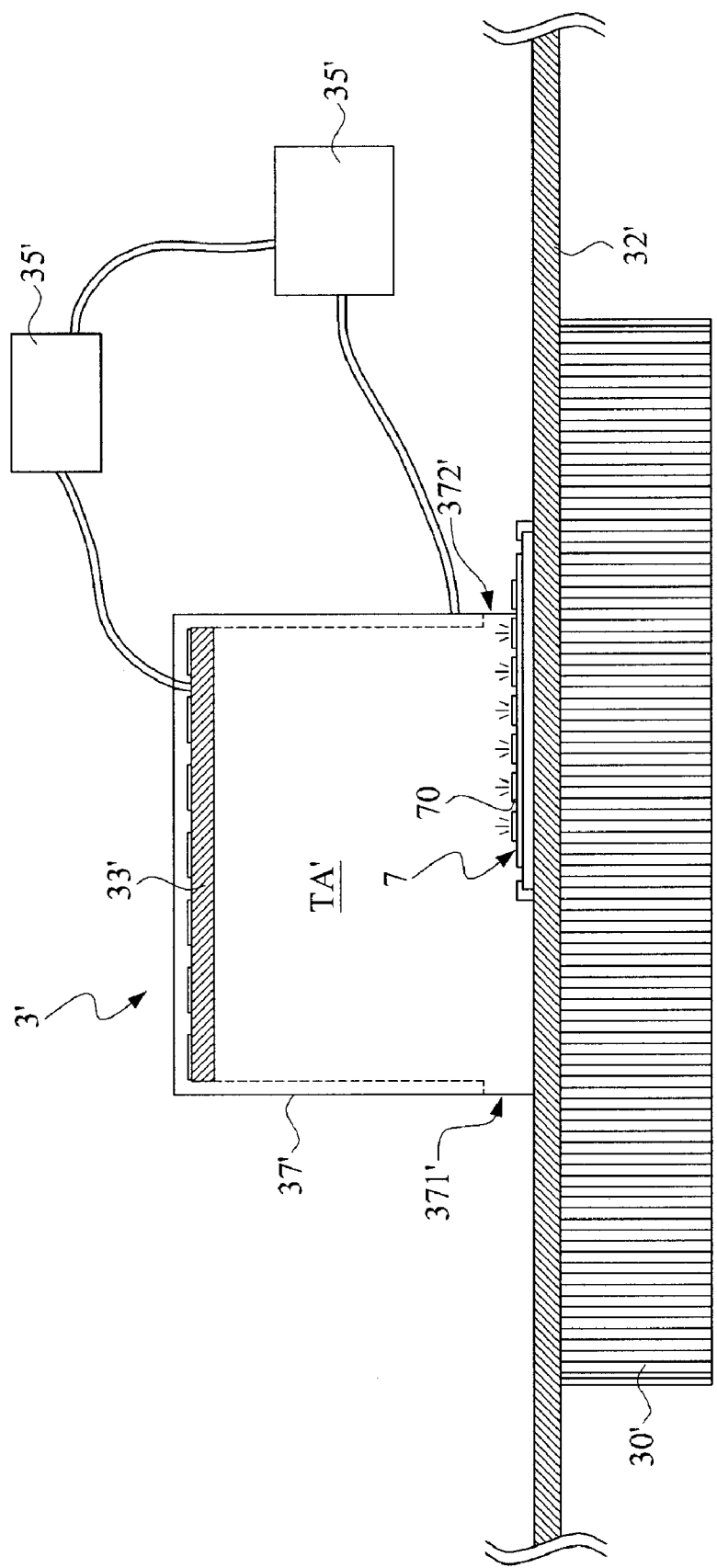
FIG. 11 shows a next step of FIG. 10, in which the DUT is moving out of the test area.
Figure 12:
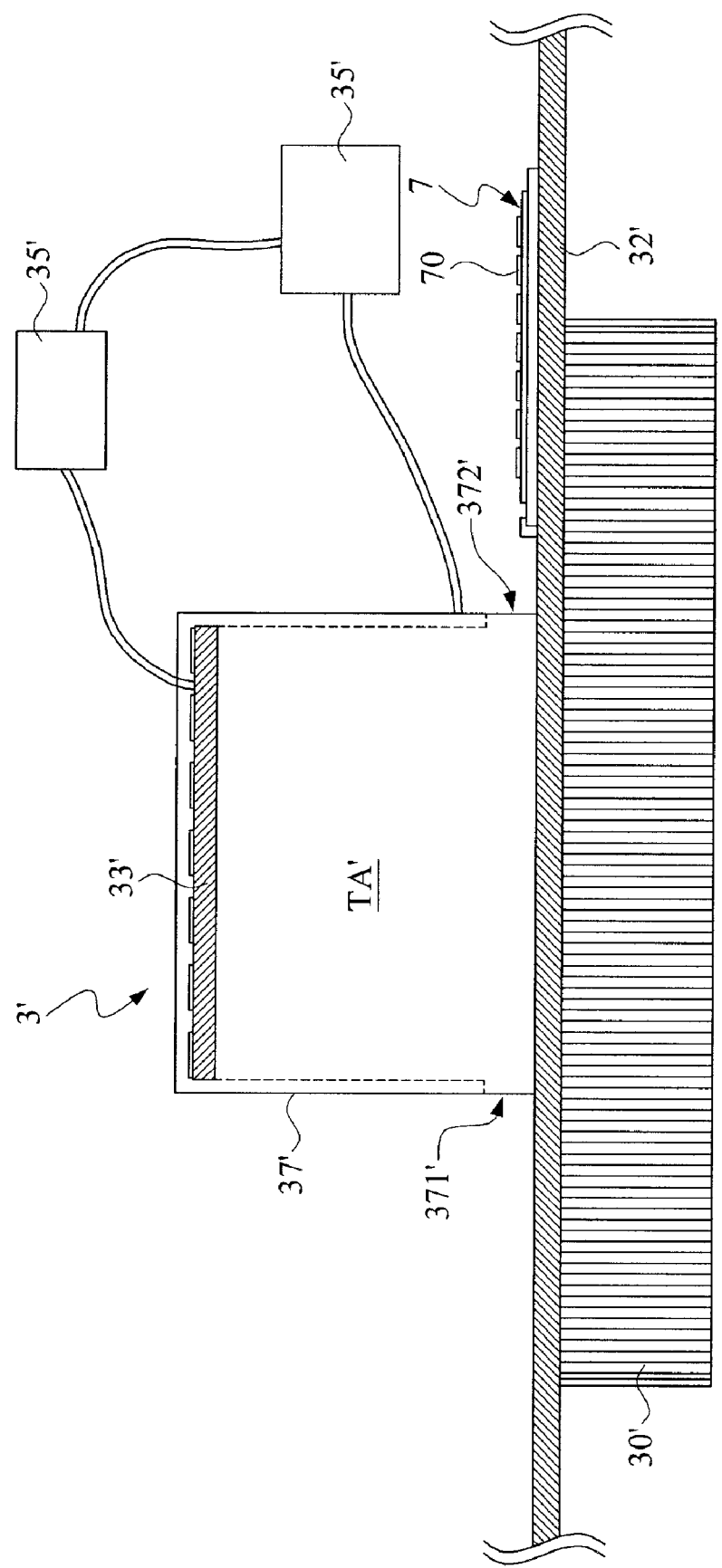
FIG. 12 shows a next step of FIG. 11, in which the DUT is completely moved out of the test area.
Figure 13:
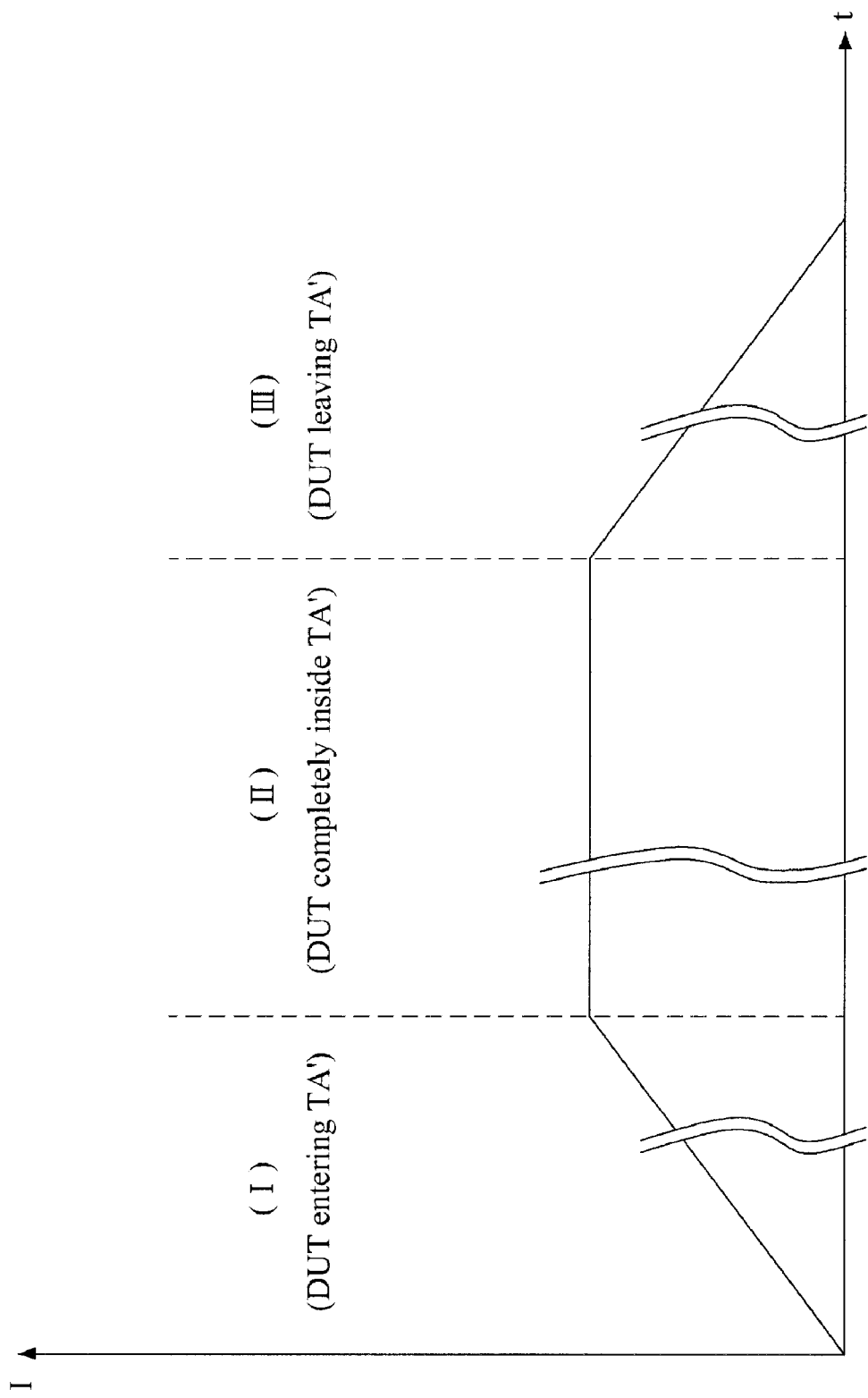
FIG. 13 shows a luminous intensity response from testing a healthy DUT that includes no ill-luminous element.

Theoretically, for a healthy DUT 7, the change of the photo energy received by the solar cell module 33' from the state of FIG. 8 to the very-first state of FIG. 10 is at a strict-increasing mode, as shown in the stage (I) of FIG. 13, which illustrates schematically the changes in the received photo energy (realized by the luminous intensity I) of a healthy DUT 7 by the solar cell module 33' from FIG. 8 to FIG. 12. While the DUT 7 is completely moved within the test area TA' as shown in FIG. 10, the corresponding luminous intensity received by the solar cell module 33' is illustrated in the stage (II) of FIG. 13.

Referring now to FIG. 11, the DUT 7 of FIG. 10 is moved forward further to have the leading light-emitting element 70 of the DUT 7 moved out of the test area TA' via the outlet port 372' of the dome 37', i.e. leaving the reign of the test area TA'. At this time, for the leading light-emitting element 70 is located outside the test area TA', the base 30' is to terminate the powering of the leading light-emitting element 70. Namely, the leading light-emitting element 70 is to go off, but the rest of the light-emitting elements 70 within the dome 37' are still in a light-on state. At this state, the change of the received luminous intensity I in FIG. 13 is transient from stage (II) to the state (III).

Refers now to FIG. 12, in which the DUT 7 is completely moved out of the dome 37', and thus all the light-emitting elements 70 of the DUT 7 are gone off. At this time, no photo energy of the DUT 7 can be received by the solar cell module 33'.

From the state of FIG. 11 to that of FIG. 12, the change of the luminous intensity I received by the solar cell module 33' is to demonstrate a strict-decreasing mode as shown by the stage III of FIG. 13.

Figure 14:
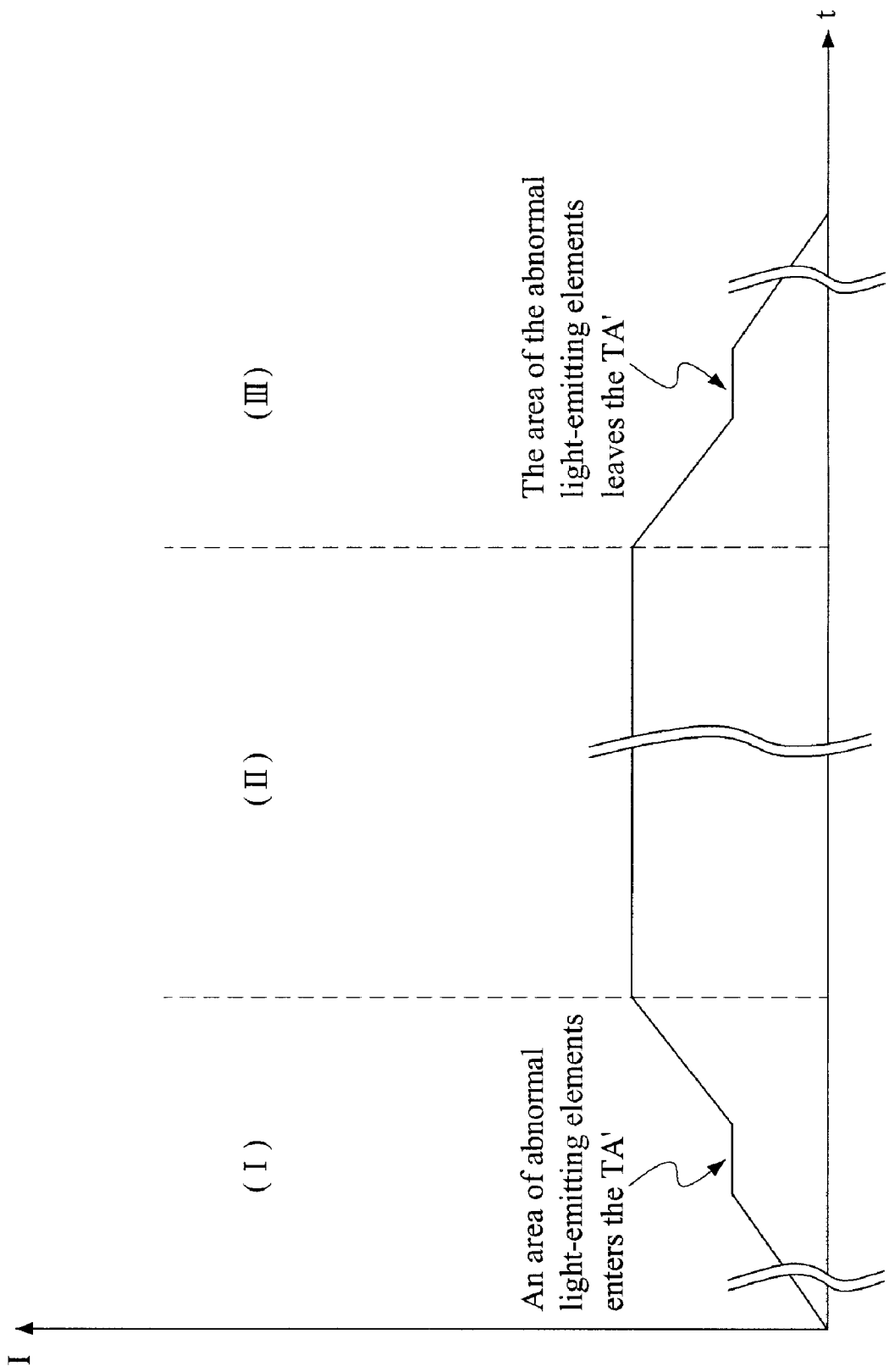
FIG. 14 shows a luminous intensity response from testing the DUT of FIG. 13 that includes an area of abnormal light-emitting elements.

In the present invention, the change in the received photo energy in the test area TA' (for example FIG. 13 as shown), transmitted from either way of FIG. 7 from the solar cell module 33' to the processing unit 35', is processed by the processing unit 35'. As long as the processing unit 35' detects that the change (may in analog or digital form) in a DUT 7 differs to that for the healthy DUT 7 as shown in FIG. 12, it implies that at least one area of abnormal light-emitting elements 70 (each area including at least one light-emitting element 70) exists in the current DUT 7. Refers to FIG. 14, a change of the luminous intensity response from testing the DUT that includes an area of abnormal light-emitting elements is typically shown. Upon further computation, the area of abnormal light-emitting elements 70 in the DUT 7 can be precisely located.

Figure 15:
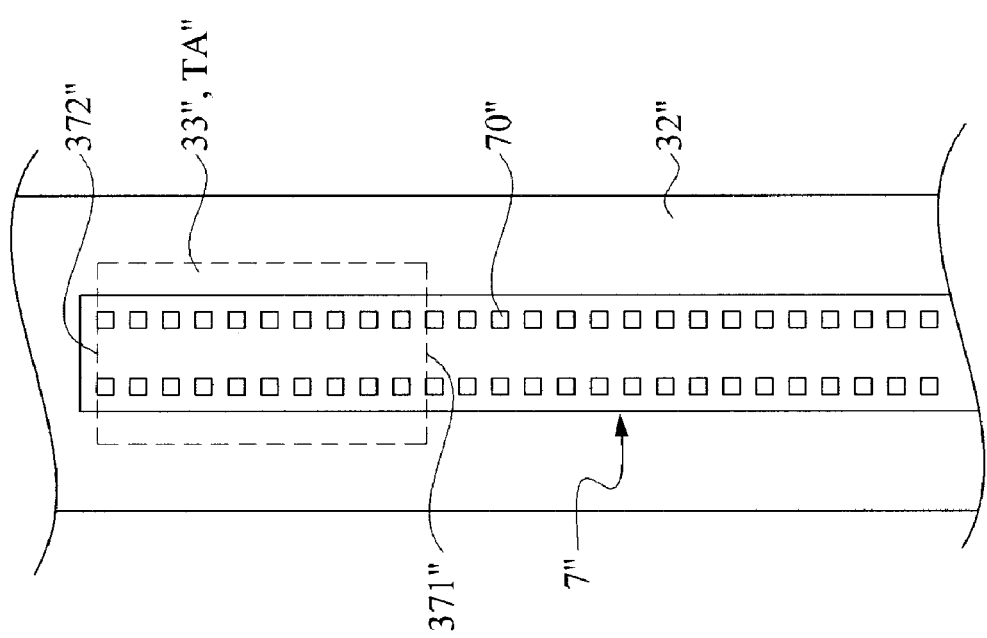
FIG. 15 shows part of another DUT on the moving carrier unit in a top view according to FIG. 7.

In the preceding descriptions about FIG. 8 to FIG. 14, the DUT 7 formed as a light bar has a length smaller than the test length of the test area TA'. However, it is understood that the length of the light bar to be tested by the method and the system of the present invention can be variant. Referring to FIG. 15, part of another DUT 7" on the moving carrier unit 32" in a top view according to FIG. 7 is shown, in which the DUT 7" includes two parallel light-emitting elements 70" and has a length larger than the length of the test area TA". For the length features of the DUT 7" of FIG. 16, the luminous intensity response of the DUT 7" is lengthy in stage II.

Figure 16:
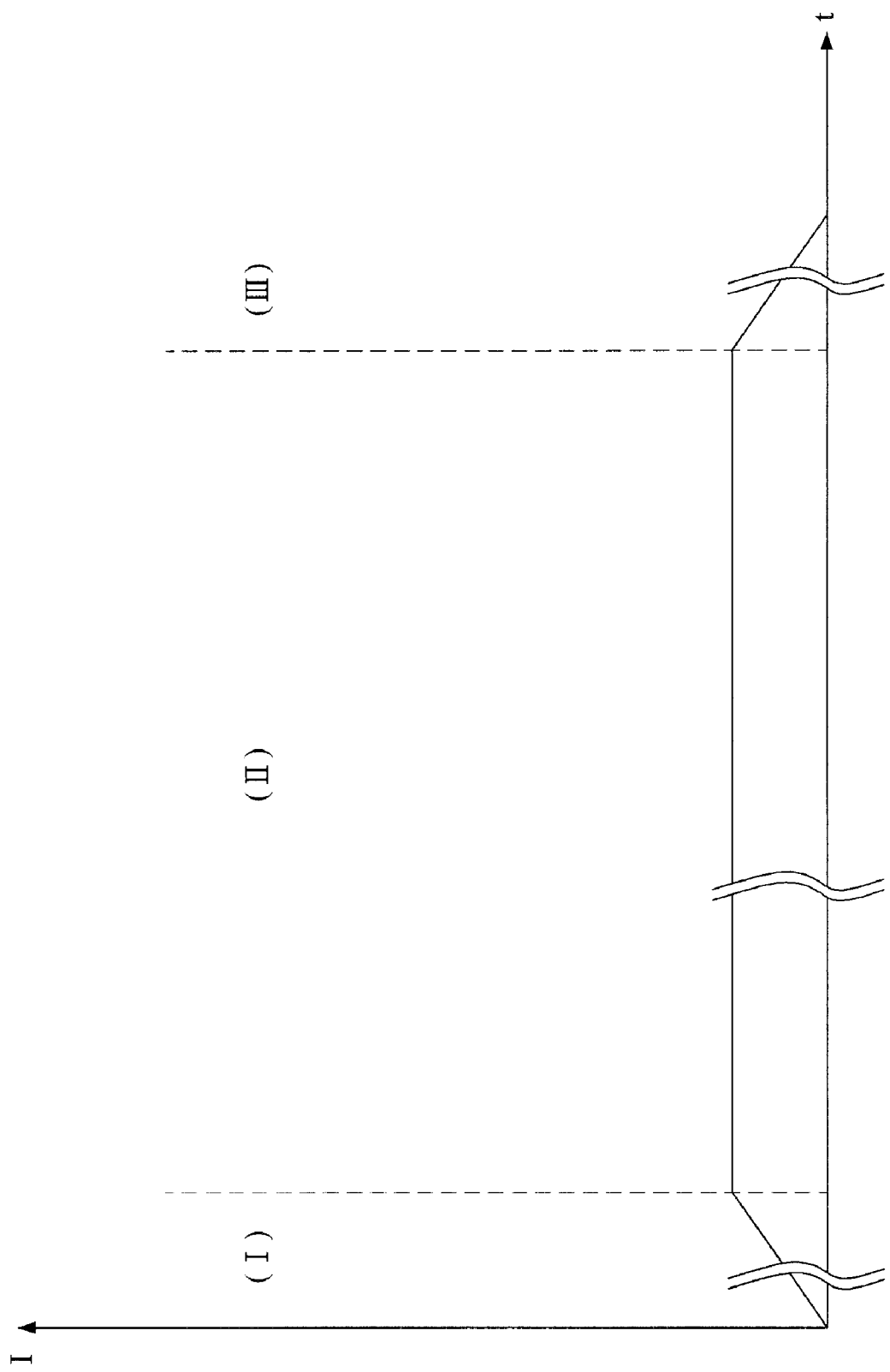
FIG. 16 shows a response from testing the DUT of FIG. 15 that includes no abnormal light-emitting element.
Figure 17:
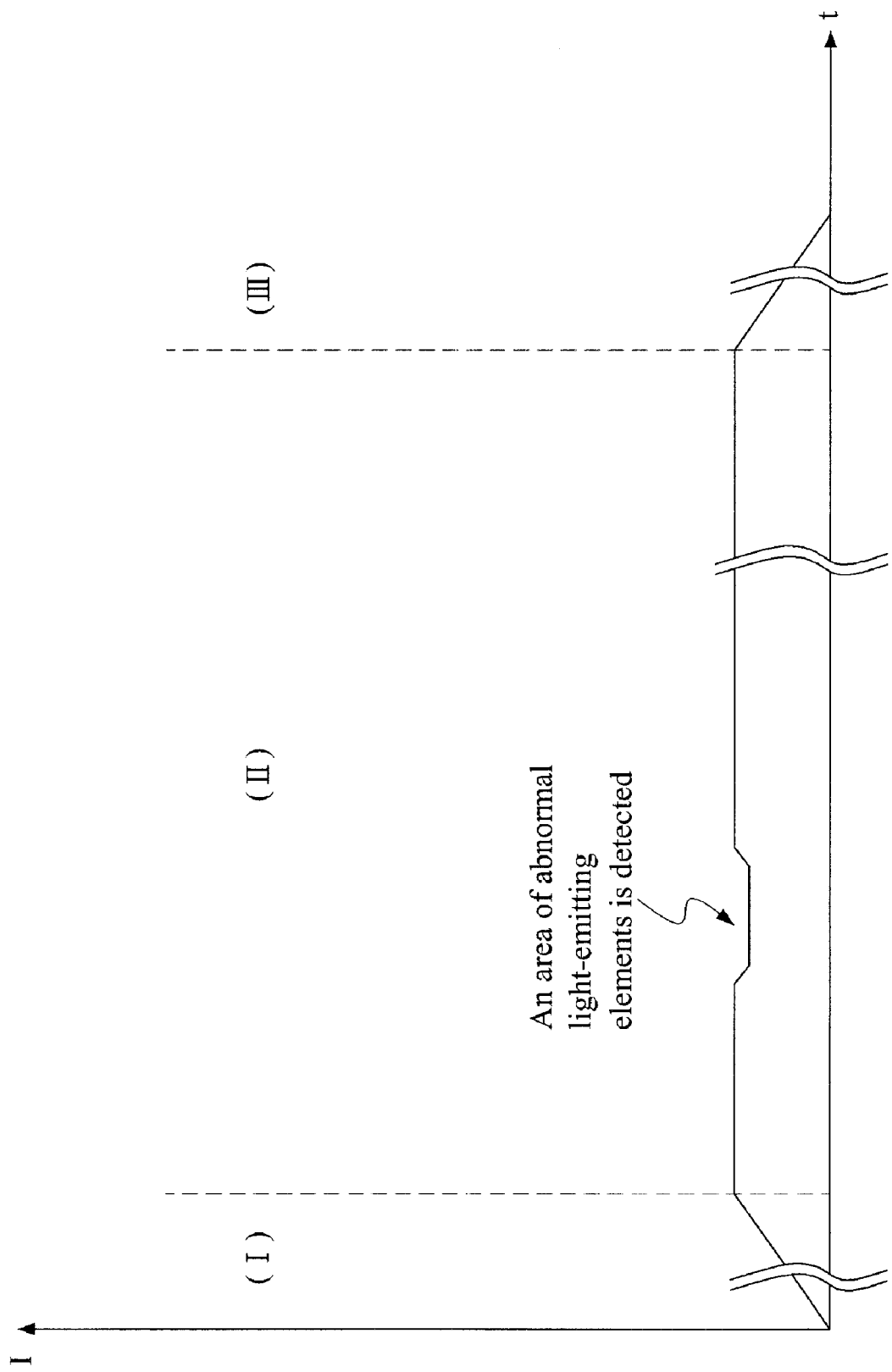
FIG. 17 shows a response from testing the DUT of FIG. 15 that includes an area of abnormal light-emitting elements.

Referring to FIG. 16, a response from testing the DUT 7" of FIG. 15 that includes no abnormal light-emitting element is shown. On the other hand, referring to FIG. 17, a response from testing the DUT 7" of FIG. 15 that includes an area of abnormal light-emitting elements 70 is shown, if and only if the abnormal light-emitting elements do not exist in the leading or ending portion of the DUT 7, which the corresponding abnormal area would be shown in the rising stage I or the descending state III of FIG. 17, respectively.

In FIG. 15, parallel light-emitting elements 70" may also belong to respective light bars that are parallel arranged. Further, it can be understood, though not shown herein, that more than two parallel light bars can be arranged for simultaneous testing as well. For the machine speed is always slower than the signal speed, the abnormal area in the DUT can be precisely detected and located by the method and the system of the present invention.

In the foregoing description of the method for testing light-emitting devices in a batch-wise, the light-emitting elements are in the form of light-emitting diodes and the light-emitting devices are in the form of light bars, in which each of the light bar has thereon a predetermined number of the light-emitting diodes. Such a formation can be easily adopted into the test system of the second aspect shown in FIG. 7. On the other hand, the light-emitting elements can be in the form of light-emitting chips on a wafer and the light-emitting devices can be in the form of a raw or column of the light-emitting chips on the wafer. At this time, the test system of the first aspect shown in FIG. 5 can be adopted for performing the test method of the present invention.

By providing the method and the system for testing light-emitting elements in accordance with the present invention, the abnormal light-emitting elements in any kind of DUTs can be quickly and precisely located, and the cost required in examining a huge number of the DUTs can be substantially reduced.

While the present invention has been particularly shown and described with reference to a preferred embodiment, it will be understood by those skilled in the art that various changes in form and detail may be without departing from the spirit and scope of the present invention.

We claim:

1. A system for testing light-emitting devices in a batch-wise, comprising:
    a base for uploading and energizing purposely a plurality of light-emitting devices, each of the light-emitting devices further having a plurality of light-emitting elements;
    a test area located over the base to define a limited space for testing the light-emitting devices, wherein the base only energizes the light-emitting elements in the test area;
    a moving carrier unit for transporting the light-emitting devices in a batch-wise to pass the base and the test area for testing; and
    a solar cell module for detecting the light-emitting elements in the test area, mounted in the test area in a location above the base, said solar cell module including at least a solar cell, said at least one solar cell including at least an action surface to face said base as well as said light-emitting elements on said base, said action surface being spaced from said light-emitting devices on said base by a predetermined distance in a manner that photo energy of said light-emitting elements on said base received by said action surface is substantially greater than photo energy diffused out of said at least solar cell.

2. The system for testing light-emitting device in a batch-wise according to claim 1, further including a processing unit for receiving signals from said solar cell module.

3. A system for testing light-emitting devices in a batch-wise, comprising:
    a base for uploading and energizing purposely a plurality of light-emitting devices, each of the light-emitting devices further having a plurality of light-emitting elements;
    a test area located over the base to define a limited space for testing the light-emitting devices, wherein the base only energizes the light-emitting elements in the test area;
    a moving carrier unit for transporting the light-emitting devices in a batch-wise to pass the base and the test area for testing; and
    a solar cell module for detecting the light-emitting elements in the test area, mounted in the test area in a location above the base, said solar cell module including at least a solar cell, said solar cell module having a filter set to shield said at least one solar cell, said at least one solar cell further having a respective wavelength response function, and the filter set further having a transmission function to be multiplied by a wavelength response function for obtaining a respect visual effect function of said solar cell module.

\* \* \* \* \*